(12) United States Patent
Hirayama

(10) Patent No.: US 9,660,140 B2
(45) Date of Patent: May 23, 2017

(54) ULTRAVIOLET LIGHT EMITTING DIODE AND METHOD FOR PRODUCING SAME

(71) Applicant: RIKEN, Saitama (JP)

(72) Inventor: Hideki Hirayama, Saitama (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 14/440,342

(22) PCT Filed: Oct. 15, 2013

(86) PCT No.: PCT/JP2013/078019
§ 371 (c)(1),
(2) Date: Jul. 27, 2015

(87) PCT Pub. No.: WO2014/069235
PCT Pub. Date: May 8, 2014

(65) Prior Publication Data
US 2015/0372190 A1    Dec. 24, 2015

(30) Foreign Application Priority Data

Nov. 2, 2012 (JP) ................................ 2012-242516

(51) Int. Cl.
*H01L 33/12* (2010.01)
*H01L 33/32* (2010.01)
(Continued)

(52) U.S. Cl.
CPC .......... *H01L 33/12* (2013.01); *H01L 21/0242* (2013.01); *H01L 21/0254* (2013.01);
(Continued)

(58) Field of Classification Search
CPC .................................................. H01L 27/153
See application file for complete search history.

(56) References Cited

U.S. PATENT DOCUMENTS 6,091,083 A * 7/2000 Hata ..................... H01L 33/007
257/190
6,139,760 A * 10/2000 Shim ....................... H01J 9/025
216/24

(Continued)

FOREIGN PATENT DOCUMENTS

JP    2009-54780 A    3/2009

OTHER PUBLICATIONS

Hirayama, H. et al., "231-261 nm AlGaN deep-ultraviolet light-emitting diodes fabricated on AlN multilayer buffers grown by ammonia pulse-flow method on sapphire", Appl. Phys. Lett. 91, 071901 (2007).

(Continued)

*Primary Examiner* — Eugene Lee
(74) *Attorney, Agent, or Firm* — Seed IP Law Group LLP

(57) ABSTRACT

An ultraviolet LED having increased light extraction efficiency includes: a single crystal sapphire substrate on which an array of protruding portions are formed; an AlN crystal buffer layer formed on the sapphire substrate; and an ultraviolet light emitting layer, in contact with the buffer layer, formed into a layered stack including an n-type conductive layer, a recombination layer, and a p-type conductive layer, in order from the buffer layer. The buffer layer includes a pillar array section and an integration section wherein pillars in the array are connected with one another. Each pillar extends from a protruding portion of the sapphire substrate, in a direction normal to one surface thereof. The pillars are separated from one another in the plane of the surface by a gap G. Light emitted from the ultraviolet light emitting layer is extracted to the outside through the pillar array section and the sapphire substrate.

6 Claims, 12 Drawing Sheets

(51) Int. Cl.
  *H01L 33/00* (2010.01)
  *H01L 33/20* (2010.01)
  *H01L 21/02* (2006.01)

(52) U.S. Cl.
  CPC .... *H01L 21/0265* (2013.01); *H01L 21/02458* (2013.01); *H01L 21/02494* (2013.01); *H01L 21/02639* (2013.01); *H01L 33/007* (2013.01); *H01L 33/20* (2013.01); *H01L 33/32* (2013.01); *H01L 2933/0033* (2013.01)

(56) References Cited

U.S. PATENT DOCUMENTS

| | | | | |
|---|---|---|---|---|
| 6,841,808 B2* | 1/2005 | Shibata | ............... | H01L 21/0237 257/190 |
| 7,053,420 B2* | 5/2006 | Tadatomo | ............... | H01L 33/22 257/103 |
| 7,655,490 B2* | 2/2010 | Ishida | ............... | C30B 25/02 438/41 |
| 7,811,847 B2 | 10/2010 | Hirayama et al. | | |
| 7,884,376 B2* | 2/2011 | Lu | ............... | H01L 33/387 257/81 |
| 8,026,118 B2* | 9/2011 | Shinohara | ............... | H01L 33/38 257/103 |
| 8,035,113 B2* | 10/2011 | Moustakas | ............... | B82Y 20/00 257/103 |
| 8,298,842 B2* | 10/2012 | Son | ............... | H01L 33/007 257/98 |
| 8,648,522 B2* | 2/2014 | Hsu | ............... | H01L 33/007 313/498 |
| 2007/0206130 A1* | 9/2007 | Wuu | ............... | H01L 33/20 349/88 |
| 2009/0166650 A1* | 7/2009 | Huang | ............... | H01L 33/007 257/94 |
| 2010/0244077 A1* | 9/2010 | Yao | ............... | H01L 33/0079 257/98 |
| 2010/0320440 A1* | 12/2010 | Khan | ............... | B82Y 20/00 257/13 |
| 2011/0073838 A1* | 3/2011 | Khan | ............... | H01L 27/153 257/13 |

OTHER PUBLICATIONS

Hirayama, H. et al., "222-282 nm AlGaN and InAlGaN-based deep-UV LEDs fabricated on high-quality AlN on sapphire", Phys. Stat. Solidi (a), 206, 1176, (2009).

Hirayama, H. et al., "Marked Enhancement in the Efficiency of Deep-Ultraviolet AlGaN Light-Emitting Diodes by Using a Multiquantum-Barrier Electron Blocking Layer", Appl. Phys. Express, 3, 031002 (2010).

\* cited by examiner

FIG. 6A Sample 1
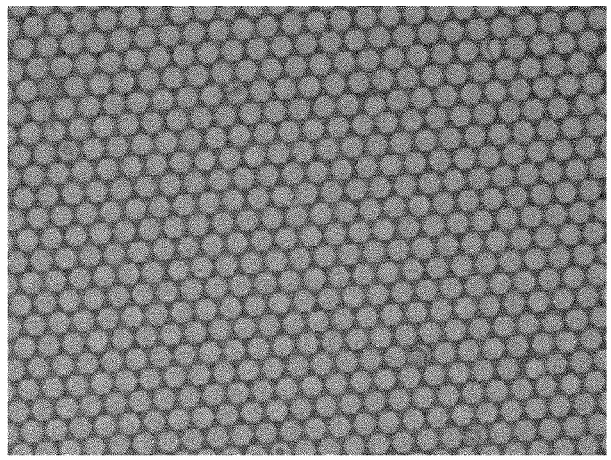
FIG. 6B Sample 2
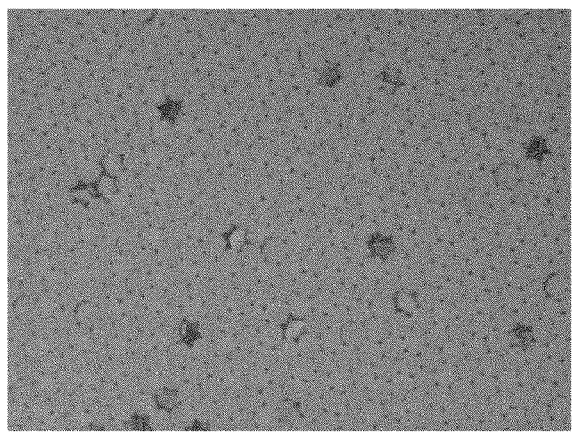
FIG. 6C Sample 3
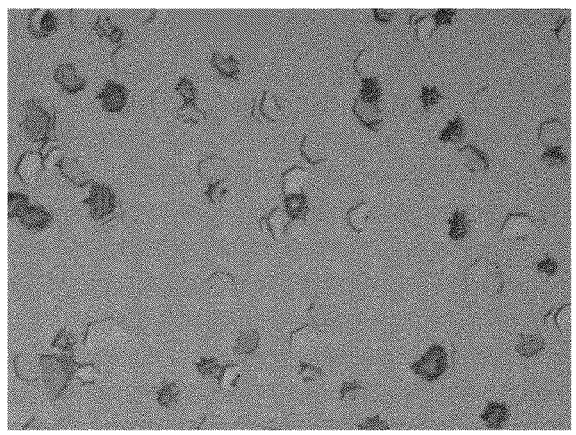

Sample 1

Sample 2

Sample 3

ULTRAVIOLET LIGHT EMITTING DIODE AND METHOD FOR PRODUCING SAME

BACKGROUND

Technical Field

The present disclosure relates to an ultraviolet light-emitting diode (UV-LED) having improved efficiency, and a method for producing the same.

Description of the Related Art

Solid state light-emitting elements utilizing nitride semiconductor material, among others, blue light-emitting diodes have been widely used. Similar solid state light-emitting elements are in demand for application to a shorter wavelength range. Thus ultraviolet light-emitting diodes have been developed using similar material groups to that of the blue LEDs. In particular, LEDs for the deep ultraviolet range, or deep UV LEDs (DUVLEDs) have been under development, because ultraviolet (UV) light, to be more specific, light at a short wavelength of around 260 nm or in the deep ultraviolet range, is considered to have a variety of useful applications including sterilization, water purification, and medical applications. A typical DUVLED structure includes a sapphire substrate and has a layered structure made of gallium aluminum nitride series semiconductor, which contains aluminum (Al), gallium (Ga), and nitrogen (N) for its main composition. Output power of UV radiation for such DUVLEDs has been improved, and DUVLEDs operated at optical output level of 10 mW has been developed so far.

Technological challenges for such DUVLEDs include improvement of emission efficiency, as an example. The emission efficiency is measured by an external quantum efficiency $\eta_{EQE}$, which is defined as a ratio of optical energy emitted to outside of the LED to the input electric energy. The external quantum efficiency $\eta_{EQE}$ can be expressed in a factorized form into three factors of an internal quantum efficiency $\eta_{IQE}$, an electron injection efficiency $\eta_{EIE}$, and a light extraction efficiency $\eta_{LEE}$. Thus, the following relationship is found among them: $\eta_{EQE} = \eta_{IQE} \times \eta_{EIE} \times \eta_{LEE}$.

Among the three factors the internal quantum efficiency $\eta_{IQE}$ and the electron injection efficiency $\eta_{EIE}$ have already been drastically improved due to continuing development efforts for the DUVLEDs so far. Specifically, technological solutions contributed to such improvement include reduction of crystalline dislocations in the emission layer for improving the internal quantum efficiency $\eta_{IQE}$ (see, for example, Patent Document 1 and Non Patent Documents 1 and 2). For improving the electron injection efficiency $\eta_{EIE}$, it is effective to assist electron blocking performance in a p-type semiconductor layer by applying a structure called a multi-quantum barrier, or MQB, that utilizes a superlattice structure in the p-type semiconductor layer (see, for example, Non Patent Document 3). Currently a value of as much as 50-80% can be expected for a product of the internal quantum efficiency and the electronic injection efficiency $\eta_{IQE} \times \eta_{EIE}$.

RELATED ART REFERENCES

Patent Document

Patent Document 1: JP 2009-54780 A

Non-Patent Documents

Non-Patent Document 1: H. Hirayama et al., "231-261 nm AlGaN deep-ultraviolet light-emitting diodes fabricated on AlN multilayer buffers grown by ammonia pulse-flow method on sapphire", Appl. Phys. Lett. 91, 071901 (2007)

Non-Patent Document 2: H. Hirayama et al., "222-282 nm AlGaN and InAlGaN-based deep-UV LEDs fabricated on high-quality AlN on sapphire", Phys. Stat. Solidi (a), 206, 1176, (2009)

Non-Patent Document 3: H. Hirayama et al., "Marked Enhancement in the Efficiency of Deep-Ultraviolet AlGaN Light-Emitting Diodes by Using a Multiquantum-Barrier Electron Blocking Layer", Appl. Phys. Express, 3, 031002 (2010)

BRIEF SUMMARY

Technical Problem

The value of the product of the internal quantum efficiency $\eta_{IQE}$ and electron injection efficiency $\eta_{EIE}$ for DUV-LEDs has been improved considerably as described above. However, the external quantum efficiency $\eta_{EQE}$ is as little as around 4%, at the maximum. Actually, the light extraction efficiencies $\eta_{LEE}$ for conventional DUVLED are around 10%, at the maximum. Obviously it is imperative that the light extraction efficiency $\eta_{LEE}$ be improved for the DUV-LEDs.

The present inventor has sought approaches for improving the light extraction efficiency $\eta_{LEE}$ from a variety of viewpoints. Meanwhile, attention has been paid on a layer that work as a buffer (hereinafter referred to as a "buffer layer"), which a layer is usually made of aluminum nitride crystal (AlN crystal) or similar material and disposed in direct contact with the sapphire substrate. Such a buffer layer made of AlN crystal or the like has been adopted conventionally for satisfying requirements of epitaxial growth, with which a crystal of an ultraviolet emission layer should grow over the sapphire substrate with minimal dislocation density even when perfect lattice match is not obtained between the lattice constant of the ultraviolet emission layer and the lattice constant of the sapphire substrate. For that purpose, the conventional buffer layer itself has been grown epitaxially with reduced dislocations on a sapphire substrate. This is because such reduction of the dislocations leads to reduction of dislocations in the crystal of an ultraviolet emission layer that will be grown over the buffer layer; thereby the internal quantum efficiency $\eta_{IQE}$ should be improved. What was adopted by the inventor for such a purpose was precise control of crystal growth condition. As a result, threading dislocations in the lattice were successfully prevented from reaching a surface of the buffer layer, on which an ultraviolet emission layer is to be disposed, even when dislocations that would have created in the threading dislocation were found at the initial stage of the growth of the buffer layer. In particular, it was possible to terminate and remove the lattice dislocations by extinguishing them when lateral growth scheme, or in-plane direction growth scheme, was adopted until a halfway of the buffer layer growth process. It should be noted that the AlN crystal and the sapphire substrate do not absorb ultraviolet light in wavelength range longer than 200 nm, as well as visible range.

More specifically, the present inventor has tried to improve the external quantum efficiency $\eta_{EQE}$ while adverse effects are suppressed on the internal quantum efficiency $\eta_{IQE}$ and the electron injection efficiency $\eta_{EIE}$ as much as possible. It should be effective if direction conversion capability is realized in the buffer layer without deteriorating its epitaxial growth facilitation property due to low dislocation density, where the direction conversion is an optical function advantageous in improving the light extraction efficiency $\eta_{LEE}$. The apparatus disclosed herein contributes to realization of high efficient DUVLEDs by using the buffer layer, while taking advantage of its optical function advantageous in improving the light extraction efficiency $\eta_{LEE}$, or to be more specific, taking advantage of the direction conversion capability such as scattering, in addition to its low dislocation property.

Solution to Problem

It has been found by the inventor that a structure of a buffer layer called a connected pillar AlN buffer is effective in solving the problem mentioned above. The connected pillar AlN buffer realizes direction conversion capability of light while the crystal structure is maintained to one with the low dislocation density. Moreover, it has been confirmed that an operable DUVLED that can emit ultraviolet light can be manufactured using the connected pillar AlN buffer.

In one aspect of the present disclosure, provided is an ultraviolet light-emitting diode comprising: a single crystal sapphire substrate having an array of protruding portions on at least one surface thereof; a buffer layer of AlN crystal disposed in contact with the array of the protruding portions on the sapphire substrate; an ultraviolet emission layer disposed in contact with the buffer layer, wherein the ultraviolet emission layer is arranged into a layered stack including an n-type conductive layer, a recombination layer, and a p-type conductive layer, in this order from the buffer layer side; a first electrode in electrical connection with the n-type conductive layer; and a second electrode in electrical connection with the p-type conductive layer, wherein the buffer layer has a pillar array section in which a plurality of pillars are arranged in an array and an integration section that is formed by connecting the pillars with one another, wherein each of the pillars extends along a normal direction of the at least one surface from each of the protruding portions of the sapphire substrate and is separated from one another in a direction parallel to the at least one surface by a gap, and wherein light emitted from the ultra violet emission layer is extracted to outside through the pillar array section in the buffer layer and the sapphire substrate. Moreover, an ultraviolet light-emitting diode is provided as mentioned above, but without substrate, wherein light emitted from the ultra violet emission layer is extracted to outside through the pillar array section in the buffer layer.

Furthermore, disclosed herein is a method for manufacturing an ultraviolet light-emitting diode comprising steps of: preparing a single crystal sapphire substrate having an array of protruding portions on at least one surface thereof; buffer layer growth for growing a buffer layer of AlN crystal on the at least one surface of the sapphire substrate by MOVPE method with material gasses of TMAl (tri-methyl-aluminum) gas and ammonia gas; ultraviolet emission layer growth for growing an ultraviolet emission layer in such a manner that it is arranged into a layered stack including an n-type conductive layer, a recombination layer, and a p-type conductive layer, in this order from the buffer layer side; and disposing a first electrode and a second electrode, wherein the first electrode is in electrical connection with the n-type conductive layer and wherein the second electrode is in electrical connection with the p-type conductive layer, wherein the buffer layer growth step includes a pillar growth and integration step for forming a pillar array section having an array of pillars, each of pillars extending along a normal direction of the at least one surface from each of the protruding portions of the sapphire substrate, and each of the pillars being separated from one another in a direction parallel to the at least one surface by a gap, and for forming an integration section by connecting pillars from the pillar array section with one another.

An ultraviolet light-emitting diode (hereinafter referred to as an "ultraviolet LED") is a light-emitting diode that emits electromagnetic waves in a ultraviolet range, or ultraviolet light. In the present application, it is possible to manufacture an ultraviolet LED in a wavelength range around deep ultraviolet, which is a wavelength range mainly of 220-350 nm. It should be noted in the present application that the electromagnetic wave emission that is not within the visible light range, or in an ultraviolet range, may also be meant by such expressions as "light", "light emission", and so on.

The ultraviolet emission layer is typically a stack including AlGaN layers whose layers for the stack have composition expressed as $Al_xGa_{1-x}N$, where x is a value within $0 \le x \le 1$, to which small amount of element ("dopant") may be added for making the conduction type to positive or negative as necessity. The ultraviolet emission layer is fabricated, generally speaking, into a stack including an n-type conductive layer, a recombination layer, and a p-type conductive layer, in this order. In cases, each layer of the n-type conductive layer, the recombination layer, and the p-type conductive layer itself may have a layered structure of a quantum well structure, for example.

The AlN crystal buffer described herein is manufactured to have a structure of AlN buffer with coalesced pillars, called a "connected pillar AlN buffer." This structure includes a pillar array section in which plural pillars are arranged in an array and a coalition section or an integration section that is formed by coalescing or connecting the pillars with one another. In this structure, each of the pillars extends from each of the protruding portions on the substrate along a normal direction of one surface of the substrate and is separated from one another by a gap in a direction parallel to the one surface. The protruding portions on the sapphire substrate facilitate crystal growth of each pillar on the top surface of each of themselves. The buffer layer of AlN crystal provides a crystal structure with low dislocation density due to the integration section in which the pillars are connected with one another. The integration section, which is a section formed by connecting the pillars, provides direction conversion capability for light, for it has a structure with the pillars and gaps therebetween.

Advantage

According to any aspect of the present disclosure, an ultraviolet LED with increased light extraction efficiency $\eta_{LEE}$ is provided by implementing optical direction conversion capability into a buffer layer.

BRIEF DESCRIPTION OF THE SEVERAL VIEWS OF THE DRAWINGS

FIG. 6 is a differential interference microscope photograph showing typical pillars for each sample obtained in a preliminary experiment for a working example as described herein.

FIG. 12 shows graphs of performance data for a working exemplary sample for an LED element as described herein.

DETAILED DESCRIPTION

Figure 1:
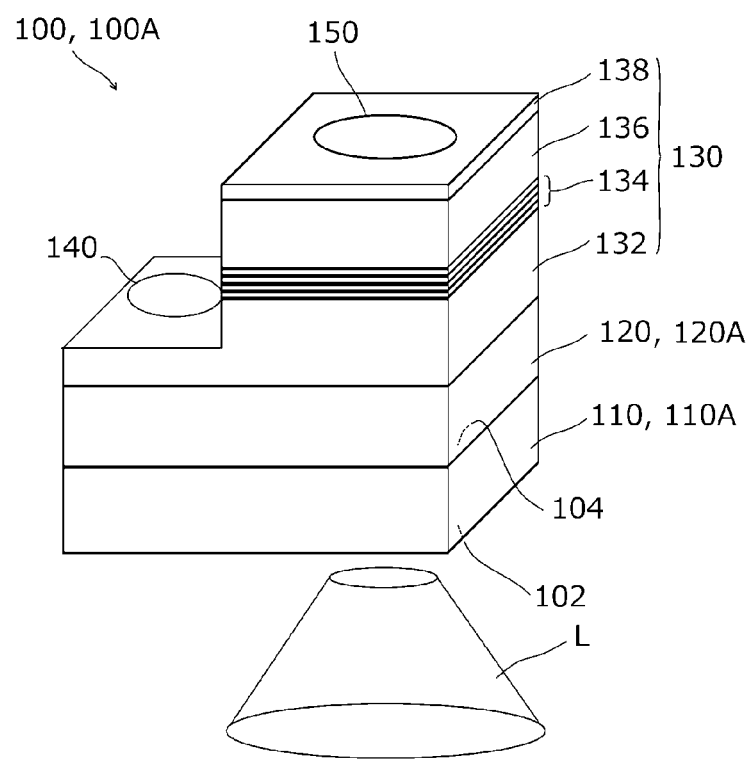
FIG. 1 is a perspective view indicating an overall structure common to an ultraviolet LED of conventional type and an ultraviolet LED according to an embodiment described herein.

An embodiment regarding an ultraviolet LED and a manufacturing method are described below based on the drawings. For all drawings, common reference numerals are given to common parts or elements unless otherwise noted.

Embodiment

Optical Function of Buffer Layer

FIG. 1 is a perspective view indicating an overall structure common to an ultraviolet LED 100 of conventional type and an ultraviolet LED 100A of the present embodiment. For the ultraviolet LEDs 100 and 100A, one surface 104 of a sapphire substrates 110 and 110A is used where the sapphire substrates 110 and 110A are a single crystal plate of $\alpha$-$Al_2O_3$; and a buffer layers 120 and 120A of AlN crystal or the like are grown in an epitaxial manner on the surfaces, respectively. Ultraviolet emission layers 130 are also grown in an epitaxial manner, in contact with the buffer layers 120 and 120A. The ultraviolet emission layers 130 for both of the conventional ultraviolet LED 100 and for ultraviolet LED 100A of the present embodiment have a common structure. Specifically the structure of the ultraviolet emission layer 130 has a stack including: an n-type conductive layer 132, a recombination layer 134, and a p-type conductive layer 136, in this order from the buffer layer 120. Typical material for the ultraviolet emission layer 130 is a composition of AlGaN itself, or this composition doped with minute amount of element. Moreover, a first electrode 140 and a second electrode 150 are electrically connected to the n-type conductive layer 132 and the p-type conductive layer 136, respectively. Typical structure may include a contact layer 138 for establishing electrical connection between the p-type conductive layer 136 and the second electrode 150.

Specific structure for each layer will be described in more detail. Regarding the ultraviolet emission layer 130, the n-type conductive layer 132 is an $Al_{0.87}Ga_{0.13}N$ layer doped with Si for n-type conduction, or an $Al_{0.87}Ga_{0.13}N$; Si layer. The recombination layer 134 is a stack body of multi-quantum well (MQW) structure in which a superlattice structure of thin layers having $Al_{0.87}Ga_{0.13}N$ and $Al_{0.78}Ga_{0.22}N$ compositions, where the number of quantum wells in the recombination layer 134 is 3 in a typical structure. The p-type conductive layer 136 is, for example, a stack body of MQB structure with chirped periods. It is possible to reflect electron toward the recombination layer 134 side and to block electron, because the p-type conductive layer 136 creates an alternating electronic potential and, as a result, the blocking ability of against electron is improved with extended energy band for reflection. Specifically, an example structure utilizes layered body of 23 layers or the like in total that is provided with layers of $Al_{0.95}Ga_{0.05}N$; Mg with varying thickness, whose interfaces are provided with a delta-dope like thin layer of $Al_{0.77}Ga_{0.23}N$; Mg, and that is provided a relatively thick $Al_{0.77}Ga_{0.23}N$; Mg layer at the top of the structure. It is to be noted such compositions and the number of layers are specified merely to describe an exemplary structure; thus modifications for adjusting emission wavelength may be made in actual elements. More specifically, it is possible to adopt a multi-quantum barrier (MQB) structure in the electron block layer as reported in Non Patent Document 3 by the inventor. In addition, the contact layer 138 is adopted because it would be difficult to implement current injection function if the material contains Al, such as $Al_{0.77}Ga_{0.23}N$; Mg layer, due to a significantly deepened acceptor level in the p-type conductive layer 136. Furthermore, the first electrode 140 and the second electrode 150 are metal electrodes having a structure of Ni and Au (or "Ni/Au") from the base layer side. This Ni layer is a very thin layer of 1 nm thick provided for establishing ohmic contact between Au and the base semiconductor layer.

The optical output in the ultraviolet LED such as ultraviolet LED 100 or 100A is limited to light L out of entire light generated in the recombination layer 134, where the light L goes out from a light extraction surface 102, or an opposite surface of the one surface 104. Here, the shape of the ultraviolet LED 100 is generally a planer shape, that is, thickness from the buffer layer 120 or 120A to the second electrode 150 is 100 μm, at the maximum, and the in-plane extent of the sapphire substrate 110 or 110A is around 500 μm×500 μm or larger. Refractive index for emission wavelength of material that makes the ultraviolet LED 100 is much larger than 1, which is refractive index for surrounding medium, or such as air or vacuum. From these conditions, a part of light emitted as a result of recombination among conduction carriers inside the recombination layer 134 forms angles larger than the critical angle, against the normal direction of the plain of the ultraviolet LED 100, and the part of light propagates in waveguide modes without exiting from the ultraviolet LED 100 due to total internal reflection. The light in waveguide modes will be attenuated and dissipated until it exits to outside in the case of the conventional ultraviolet LED 100, therefore it does not contribute to the optical output from the light extraction surface 102. This is one of mechanisms that restricts the light extraction efficiency.

It is to be noted that the buffer layer 120 in conventional structure has been introduced for the purpose of growing the AlGaN crystal epitaxially onto the sapphire substrate 110. That is, the conventional buffer layer 120 has been adopted to satisfy requirements for improving the internal quantum efficiency $\eta_{IQE}$ through the formation of high quality crystal in the AlGaN layer on the sapphire substrate 110.

Then, in the case of the ultraviolet LED 100A of the present embodiment, the light extraction efficiency $\eta_{LEE}$ is improved by outputting light that will propagate in waveguide modes from the light extraction surface 102 by way of function of the buffer layer 120A. That is, the improvement of the light extraction efficiency $\eta_{LEE}$ in the ultraviolet LED 100A is achieved with the help of direction conversion capability implemented in the buffer layer 120A. More specifically the buffer layer 120A in the present embodiment is fabricated to have a structure called a connected pillar AlN buffer. This structure is one that satisfies the requirement of the crystal growth mentioned above by effectively utilizing the direction conversion capability. In the present embodiment, direction of light propagating through the buffer layer 120A is redirected while the internal quantum efficiency $\eta_{IQE}$ is maintained to a level comparable with the one obtained with the buffer 120. The light extraction efficiency $\eta_{LEE}$ is improved in the ultraviolet LED 100A of the present embodiment by outputting, though the light extraction surface 102, at least a part of light that should have been lost due to the waveguide mode propagation in conventional cases.

Structure of Connected Pillar AlN Buffer

Figure 2:
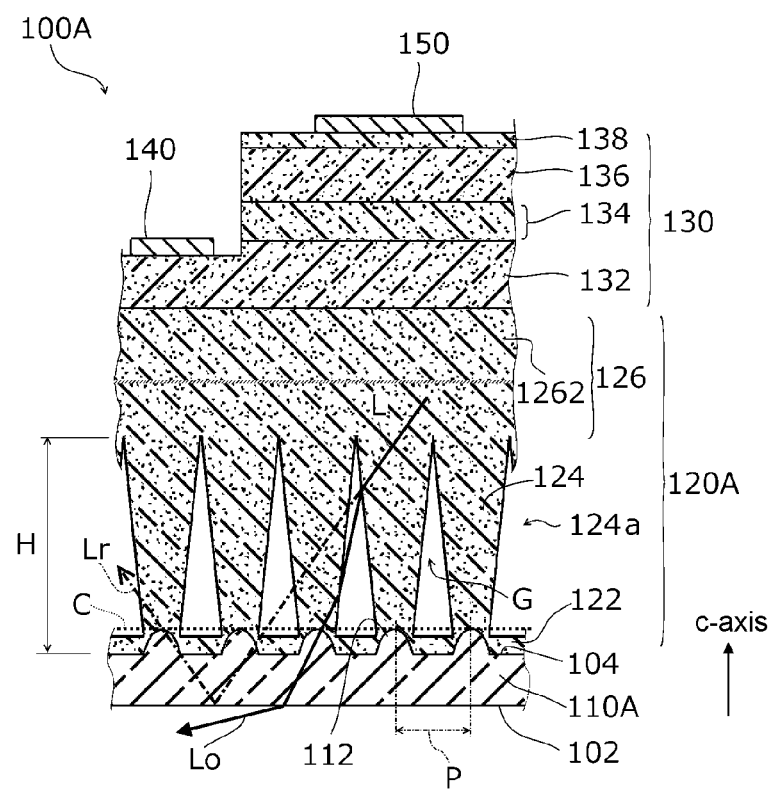
FIG. 2 is a schematic cross sectional view indicating overall structure of an ultraviolet LED in the embodiment described herein, in which a buffer layer of connected pillar AlN buffer is adopted.

FIG. 2 is a schematic cross sectional view indicating overall structure of an ultraviolet LED 100A in the present embodiment, in which a buffer layer 120A of connected pillar AlN buffer is adopted. In place of the conventional sapphire substrate 110 having a smooth surface, a sapphire substrate 110A is adopted for the ultraviolet LED 100A of the preset embodiment, where an array of protruding portions 112 are provided on at least one surface 104 of the sapphire substrate 110A. The sapphire substrate 110A with the array of protruding portions 112 is referred to as "PSS (patterned sapphire substrate) 110A." The PSS 110A adopted herein is a sapphire substrate with (0001) surface orientation, thus c-axis extends along the normal direction of the one surface 104. Each of the protruding portions 112 formed on the one surface 104 of the PSS 110A has circular periphery and forms a bump shape of an island separated from other protruding portions 112. The buffer layer 120A has a pillar array section 124a and an integration section 126, where the pillar array section 124a is an array of plural pillars 124, whereas the integration section 126 is formed by connecting pillars 124. Each of the pillars 124 extends along the normal direction of the one surface 104, or along the c-axis direction, from each of the protruding portions 112 on the PSS 110A, and when it comes to plural pillars 124, each pillar 124 is separated from one another by a gap G in directions parallel to the one surface 104.

Details of the pillars 124 are as follows. Each pillar 124 connects to each protruding portion 112 at its PSS 110A side, whereas its ultraviolet emission layer 130 side is connected with neighboring pillars 124. The integrated part within the buffer layer 120A due to such connection is called an integration section 126, which is also a layer region near the ultraviolet emission layer 130 side in the buffer layer 120A. The structure of the pillars 124 in their PSS 110A side includes gaps G between pillars 124, where the gap G surrounds all sides of each of the pillars 124. The structure of the pillar 124 would be analogous to shape of a pillar for a building supporting a ceiling or the integration section 126 on its upper side, whose bottom side is placed on a cornerstone or the protruding portion 112.

Function on Crystal Growth by Connected Pillar AlN Buffer

Crystal structure of the buffer layer 120A is a single crystal grown to achieve low dislocation density. Threading dislocations inside the pillar 124 are removed or suppressed. Moreover, almost no lattice dislocation is generated inside of the integration section 126. Therefore, lattice dislocations remaining on the surface of the ultraviolet emission layer 130 side of the integration section 126 are a small number of dislocations that have been induced at connecting portions among the pillars 124 with one another and at connecting portions of the pillars 124 with the integration section 126. The threading dislocations that penetrate from the PSS 110A to the ultraviolet emission layer 130 throughout the buffer layer 120A is sufficiently suppressed as a whole.

Optical Properties of Connected Pillar AlN Buffer

Light emitted from ultraviolet emission layer 130 in the ultraviolet LED 100A in the present embodiment is extracted to outside after propagating through the pillar array section 124a of the buffer layer 120A and the PSS 110A. The light due to the recombination of the conduction carriers in the recombination layer 134 is emitted in an omnidirectional manner in nature. After emitted in this way, a fraction of light is transmitted through the pillars 124 and pillar array section 124a with the gaps G, as indicated as light L in FIG. 2. Light Lr denotes an example ray of light in the conventional ultraviolet LED 100 in which no pillar 124 is fabricated. The light having larger incident angle than the critical angle, as indicated by light Lr in the drawing, cannot exit the light extraction surface 102 of the PSS 110A or any possible surface that is parallel with the light extraction surface 102 and functioning as a light extraction surface (when a layer is provided onto the light extraction surface 102), and will be lost after propagating in a waveguide mode, where the critical angle is determined by refractive index of material just inside of the light extraction surface 102. In contrast, a part of light emitted in the ultraviolet LED 100A of the present embodiment, light Lo in the drawing, experiences refraction with its propagation direction or reflection every time it passes surfaces or interfaces formed between the pillar 124 and the gap G. The light can be redirected along the normal direction of the element compared with the critical angle and can exit to outside from the light extraction surface 102. In this respect, the larger the step difference in the refractive indices becomes between the pillar and the gap G, the more the direction conversion capability is enhanced. Thus, the interface between the pillars 124 and the gap G facilitates extraction of at least a part of light in the waveguide mode from light extraction surface 102 due to the direction conversion capability by converting propagation direction of at least a part of light in the waveguide mode.

It should be noted that actual structure of the pillars 124 occupies three dimensional volume, and the shape of them is not limited to a widened shape in FIG. 2. Moreover, microscopic crystalline pieces caused by the growth of the crystal may be formed in the actual elements, though not shown in the drawing. In addition, there may be phenomena, such as diffraction and the like, that cannot always be best described in the context of geometrical optics based on rays of light. However, the provision of the pillars 124 separated by the gaps G into the buffer layer 120A may induce phenomena, such as refraction, reflection, and diffraction, which may be regarded as scattering in a macroscopic sense. So long as such phenomena are accompanied by little loss of energy, they will facilitate extraction of light propagating in waveguide modes from the light extraction surface 102. Therefore, the direction conversion capability in the optical transmission contributes to improvement in the light extraction efficiency $\eta_{LEE}$.

For the ultraviolet LED 100A in the present embodiment, it is not always necessary to use the PSS 110A once the ultraviolet LED 100A has been manufactured. Thus a structure of the ultraviolet LED 100A in FIG. 2 falls within a category of the ultraviolet LED for the present embodiment even after the PSS 110A is removed. In such a structure, light emitted from the ultraviolet emission layer propagates through the buffer layer 120A and thereafter exits from the lower side of the buffer layer 120A, such as lower surface of pillars corresponding to cut-off plane C. The structure of the buffer layer 120A in such case improves the light extraction efficiency $\eta_{LEE}$ drastically because the pillars 124 are exposed to outside and the light extraction surface 102 does not exist there. Note that the PSS 11 OA can be removed by irradiating laser light for machining. In addition, polishing the surface of the cut-off plane C as necessity is advantageous. It is fortunate that the first electrode 140 and the second electrode 150 structures are applicable without any modification regardless of whether the cut-off plane C is used for extracting the light or not.

Furthermore, it is preferable that each of the pillars 124 has a widened shape whose cross section become larger as distance from each of the protruding portion 112 on ultraviolet LED 100A increases. The present inventor has confirmed that such a widened shape can be fabricated if crystal growth condition during the buffer layer formation is chosen appropriately. In such a structure, integration section can be fabricated from the pillars without sudden changes in the shapes of the cross section. As a result, it becomes easier than before to satisfy the requirements at a time for fabricating good quality crystal for the buffer layer 120A suitable for growing the ultraviolet emission layer 130 and for implementing the direction conversion capability in the buffer layer 120A.

It is preferable in the ultraviolet LED 100A of the present embodiment that the integration section 126 of the buffer layer 120A further includes a smoothing layer 1262 made of appropriate material such as AlN or the like, which is the material for the buffer layer 120A. Since the surface of ultraviolet emission layer 130 side of the integration section 126 is a surface of the smoothing layer 1262 in this case, crystal lattice on the surface becomes a template for subsequent crystal growth for the ultraviolet emission layer 130 with AlGaN composition. The integration section 126 with the smoothing layer 1262 allows us to prepare a good quality template crystal with almost identical quality as the conventional buffer layer 120, which is formed, for example, on the conventional sapphire substrate 110.

Manufacturing Method of Ultraviolet LED

Figure 3:
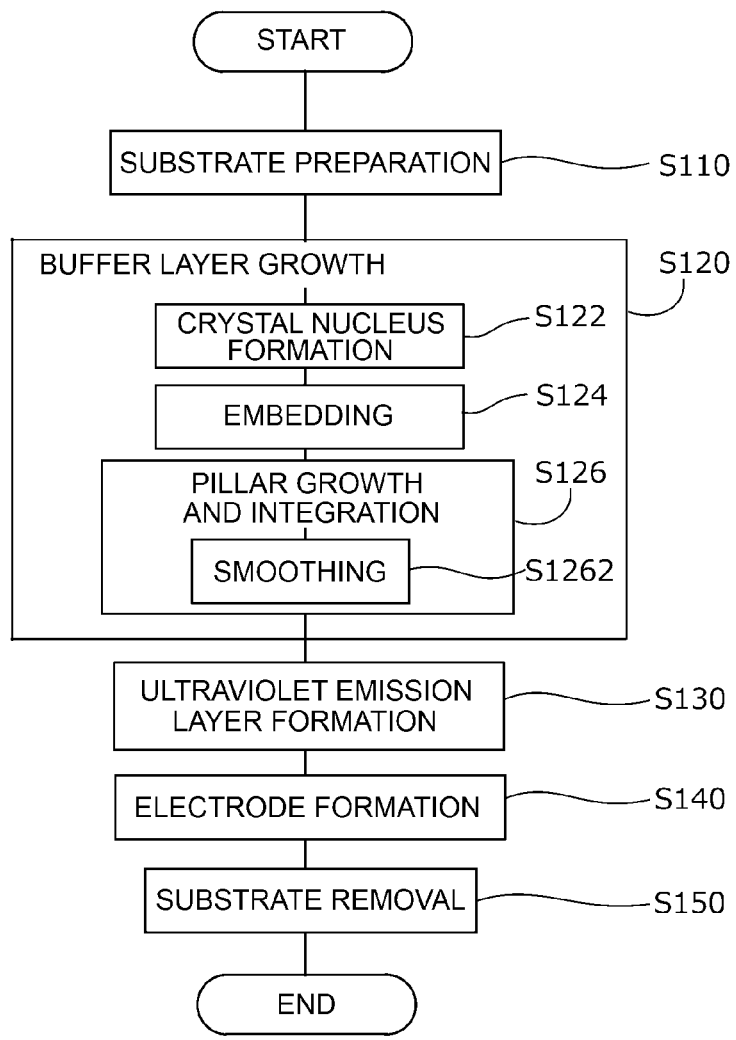
FIG. 3 is a flowchart illustrating a manufacturing method in one embodiment described herein.

The manufacturing method of the ultraviolet LED of the present embodiment will be described with focusing on a fabrication method of the structure of buffer layer 120A. FIG. 3 is a flowchart illustrating a manufacturing method of ultraviolet LED 100A in the present embodiment, and FIG. 4 is a schematic cross sectional view illustrating structures of each stage when the buffer layer 120A is fabricated in this manufacturing method.

The process for manufacturing the ultraviolet LED 100A includes a substrate preparation step S110, a buffer layer growth step S120, an ultraviolet emission layer formation step S130, and an electrode formation step S140. The process may further include a substrate removal step S150.

Figure 4A:
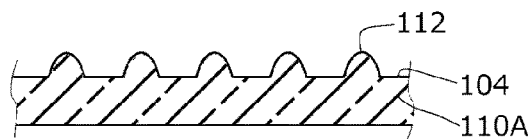
FIGS. 4A-4F are a schematic cross sectional views illustrating structures in each stage in the manufacturing method in one embodiment described herein, through which a buffer layer is fabricated.

The PSS 110A is prepared in the substrate preparation step S110 (FIG. 4A). The protruding portions 112 have been formed on the PSS 110A in a regular and periodic manner. The PSS 110A including the protruding portions 112 is a (0001) surface oriented single crystal $\alpha$-$Al_2O_3$ substrate with low dislocation density. The PSS 110A as described above is placed in a reactor of an MOVPE facility.

In the present embodiment, how to fabricate the array of the protruding portions 112 is not limited specifically. For example, it is useful to adopt a dry etching method, in which circular patterns of resist mask are provided on a surface of a common kind of sapphire plate and the etching is carried out to have controlled shape of protruding portions 112 through gradual shrinking of the circular resist mask. Note that typical surface profile of the protruding portions 112 is a semispherical surface, a cone surface, or an intermediate surface of them (FIG. 4A) having peaks or protruding surface around their central part, and such shapes were observed on actual samples.

Next, the buffer layer 120A is fabricated in the buffer layer growth step S120 to have a structure of the connected pillar MN buffer. The buffer layer growth step S120 is practiced in this embodiment with three steps: crystal nucleus formation step S122 (FIG. 4B), embedding step S124 (FIG. 4C), and pillar growth and integration step S126 (FIGS. 4D, 4E, and 4F). Optionally the pillar growth and integration step S126 may include smoothing step S1262.

In the crystal nucleus formation step S122 and embedding step S124, a method developed by the inventor for AlN buffer without pillars is applied to the crystal growth in order to grow the crystal as good quality as possible for the buffer layer 120A.

Figure 4B:
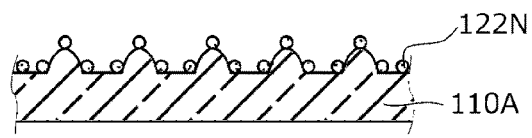

In the crystal nucleus formation step S122, an appropriate number of small crystals of AlN, referred to as "crystal nuclei 122N", are formed in a condition that facilitates growth of microscopic AlN crystals (FIG. 4B). The crystal nuclei 122N formed with this method serve as seed crystals in subsequent crystal growth process. The crystal nuclei are small pieces of single crystal, and their shapes are not specified so long as they can be nucleation seeds of the subsequent crystal growth, though they are indicated as circles in FIG. 4B. This process can be preferably performed by an MOVPE process in which ammonia is supplied in an intermittent manner, called "ammonia pulse-flow growth method."

Next, a base crystal layer 122 is grown in the embedding step S124 (FIG. 4C) to fill space among the crystal nuclei. It is preferable to perform the ammonia pulse-flow growth method and the simultaneous supply growth at least one time each. For the ammonia pulse-flow growth method to be performed herein, a condition called an enhanced lateral growth is adopted, in which a growth condition different from one in the crystal nucleus formation step S122 is used so that crystal growth coherent with already-formed crystal nuclei 122N becomes dominant in lateral direction (in-plane direction and non-polar direction) while the generation of new crystal nuclei is suppressed. The simultaneous supply growth is a method for mainly growing into a thickness direction at high growth rate by supplying both TMAl (tri-methyl-aluminum) and ammonia continuously. According to the inventor's observation, there seems to be two cases in the embedding step S124: one is that almost entire surface of the PSS 110A is covered by AlN (FIG. 4C), and the other is that only a top surface of the protruding portion 112 is covered, though not shown in the drawing. In any cases, AlN at this stage has significant influence on crystal quality of the pillars 124 to be formed. Therefore, it is preferable in the present embodiment that the ammonia pulse-flow growth method and the simultaneous supply growth mentioned above are carried out in alternately repeating manner plural times. Such repetition may reduce the number of threading dislocation that would extend in an axial direction through the pillars 124.

In the integration step S126, the pillars 124 are grown further such that each of them extends along the normal direction of a surface of the substrate from each of the protruding portions 112 of the PSS 110A and that they are separated with one another by a gap G in a direction parallel to the one surface (FIG. 4D). At the initial stage of the growth in the integration step S126, plural independent pillars 124 that make up the pillar array section 124a are grown as they are. Then the pillars 124 will be integrated with one another (FIG. 4E). As the pillars are integrated, the integration section 126 begins to take shape, and thereafter the growth continues on the top surface.

In a typical implementation of the growth process of pillars 124 as in FIG. 4D, each of the pillars 124 is grown while its cross section is gradually increased to form a widened pillar. Such growth can be performed by precisely controlling growth condition in the MOVPE method. A crucial factor among the crystal growth conditions is, based on the inventor's knowledge, supply ratio of gasses in raw material gasses, group V (five) element, or ammonia, against group III (three) element, or TMAl. To be more specific, material amount ratio of gasses, or the number of elements supplied in a unit time, or molar ratio, is used as a measure. It is possible to fabricate the pillars 124 appropriately to have the widened shape through integration step S126 by keeping a ratio of material amount of group V element divided by material amount of group III element, or molar amount of nitrogen N per unit time/molar amount of aluminum Al per unit time, to a constant. Also, the integration section 126 can be formed with such a condition. The material amount ratio of group V to group III elements may be referred to as "V/III ratio" in the field of technology of the present embodiment by presenting the value in group V element molar amount/group III element molar amount.

Exact height H (FIG. 4E) at which the independently grown pillars 124 begins to merge with one another after a period of independent growth and exact timing corresponding to the height H should inevitably suffer from fluctuations to some degree depending on the actual course of growth of the pillars 124. Therefore, the integration step S126 takes care of both the growth of the pillars 124 and formation of the integration section 126, and its termination timing can be determined such that, for example, to a timing when the integration of the pillars 124 is expect to be obtained based on an estimation according to experimental results or on experiment itself, and a marginal time of a period is added thereto. The integration step S126 is not always limited to a single process with a fixed condition, nor to a process to be performed continuously.

That is, the smoothing layer 1262 is formed (FIG. 4F) in the smoothing step S1262, which may be included optionally in integration step S126. The smoothing layer 1262 is a layer epitaxially grown on the surface of the smoothing layer 1262 with the material identical to that for the buffer layer 120A typically. The crystal growth condition of the MOVPE method is set appropriately for smoothing purposes in the smoothing step S1262 too. Also, the smoothing step S1262 can be carried out while the V/III ratio is kept to a certain value, thereby high quality crystal is obtained for the smoothing layer 1262.

It should be noted that it may be difficult to delineate the extent of the smoothing layer 1262 within the integration section 126 in the manufactured ultraviolet LED 100A, depending on circumstances. Although the integration step S126 and the smoothing step S1262 may be carried out separately by clearly differentiating some of manufacturing conditions, produced crystal for the integration section 126 may have a coherent crystal lattice if the process has been performed as intended. In such a case, especially when identical material is used for both the smoothing layer 1262 and the integration section 126, for example, it may well be difficult to distinguish the integration section 126 and the smoothing layer 1262 from each other.

In the ultraviolet emission layer formation step S130, the ultraviolet emission layer 130 with a main composition of $Al_xGa_{1-x}N$ where x is a value within $0 \le x \le 1$ is formed on a surface of a crystal lattice of the buffer layer 120A, which is used for a template and has been fabricated through the processes until integration step S126. The ultraviolet emission layer 130 is a stack body, which is laminated stack including the n-type conductive layer 132, the recombination layer 134 and the p-type conductive layer 136, in this order from the buffer layer 120A side, as shown in FIG. 1. Thereafter a contact layer 138 is formed. Gaseous material may be used for fabricating the n-type conductive layer 132, the recombination layer 134, and the p-type conductive layer 136, such as TESi (tetraethyl silane) for Si, TMGA (trymethiyl-gallium) or TEGa (tri-ethyl-gallium) for Ga, and $Cp_2Mg$ (bis-crclopentadienyl magnesium) for Mg, as well as TMAl gas and ammonia gas.

Then electrodes are formed in the electrode formation step S140. This step is to fabricate the first electrode 140 and the second electrode 150 shown in FIG. 1. For example, the first electrode 140 and the second electrode 150 are formed on the n-type conductive layer 132 and on the p-type conductive layer 136 via the contact layer 138, respectively. Finally, the PSS 110A is removed in the substrate removal step S150 as necessity.

Working Example of the Embodiment

The present embodiment will be described in detail based on its working example. Details including materials, their amounts, ratio of constituents, process details, process order, or orientation and configuration of elements or parts in the description of the following example can be modified as necessity without departing from the scope of the disclosure. Therefore, the scope of the present disclosure is not limited to the working example described below. In the following, drawings mentioned in the above will be used with the same reference numerals. In the present working example not only actual conditions for manufacturing the ultraviolet LED 100A, but a part of knowledge acquired through a preliminary experiment in determining crystal growth conditions will be described.

Figure 5:
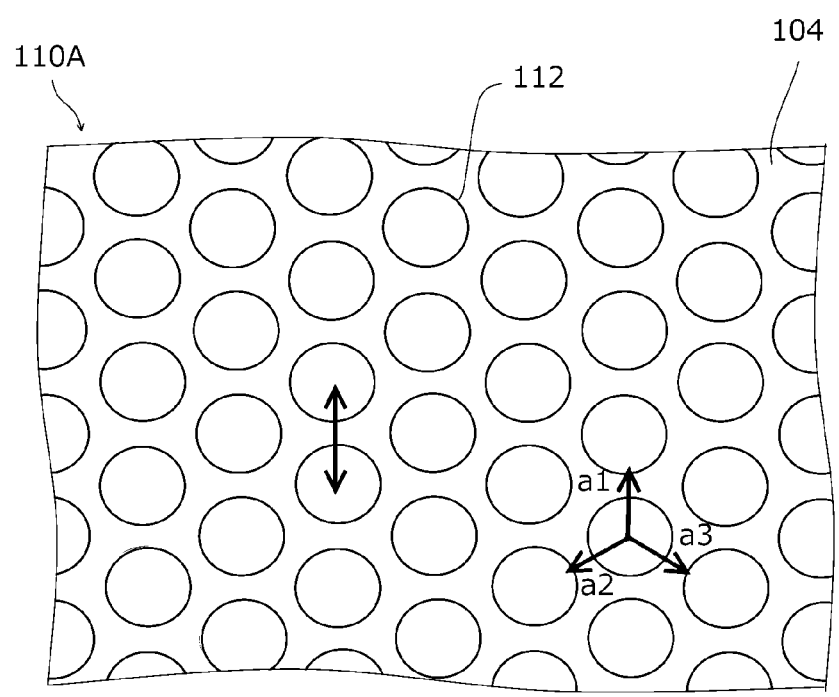
FIG. 5 is a plan view of a sapphire substrate on which an array of protruding portions are formed, or PSS, adopted in a working example as described herein.

FIG. 5 is a plan view of the PSS 110A adopted in this working example. Directions of axes a1-a3, which are crystal axes of sapphire in the PSS 110A adopted in the example, are shown on FIG. 7. The PSS 110A in the present example was a (0001) surface oriented sapphire substrate with its c-plane was in-plane direction of the substrate, or c-plane was made parallel to one surface 104 of the substrate. The PSS sample used for preliminary confirmation in the present embodiment had protruding portions 112 that were arranged in an array into triangular lattice on one surface 104, and the configuration of the triangular lattice was determined in association with crystal lattice of the sapphire. In particular, the axis of the triangular lattice connecting two protruding portions 112, indicated by a double pointing arrow in the drawing, was set to parallel to any of axes of crystal lattice of sapphire with three-fold rotational symmetry, such as the axis a1 in the drawing. The protruding portions 112 were arranged into an array of 3.4 μm pitch, whose patterns had circular peripheries with actually measured dimensions of outermost diameter of around 2.5 μm and the protruding portions 112 height of around 1 μm.

Figure 4C:
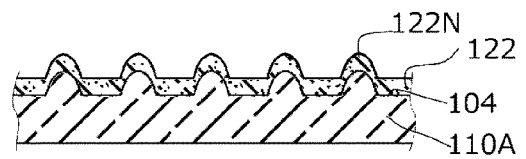
Figure 4D:
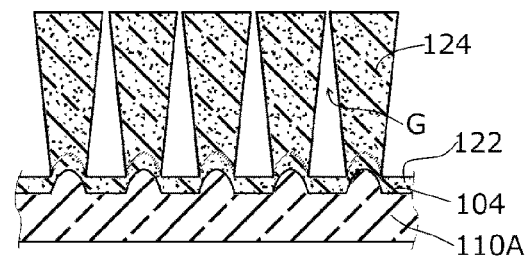
Figure 4E:
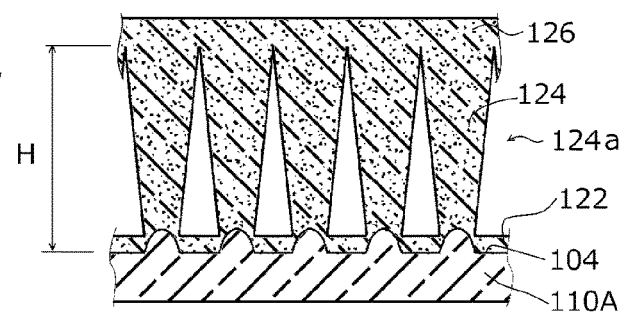
Figure 4F:
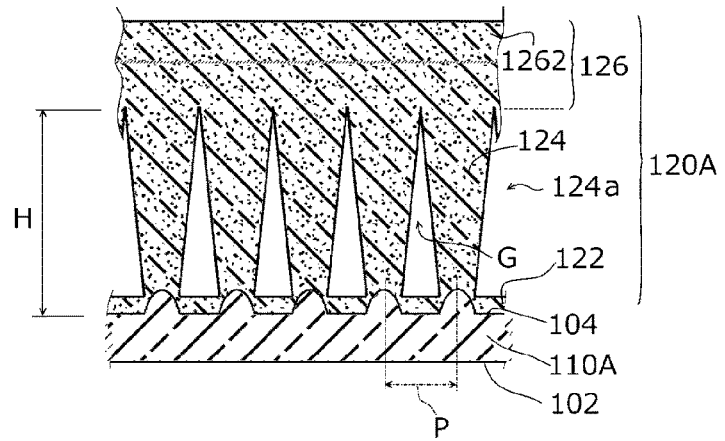

In the substrate preparation step S110 for the working example, the PSS 110A is loaded into the MOVPE facility and its temperature was raised into a predetermined high temperature for cleaning (thermal cleaning) Then the raw material gases and carrier gases for dilution were supplied to initiate the crystal growth for the buffer layer growth step S120 and ultraviolet emission layer formation step S130. The raw material gases were TMAl and ammonia in the example for fabricating the buffer layer 120A of AlN composition. The carrier gases for supplying saturated vapor of TMAl were nitrogen and hydrogen. For the initial stage of the buffer layer growth step S120, crystal nucleus formation step S122 and embedding step S124 were performed to form the base crystal layer 122, which was suitable for fabricating the pillars 124. In the crystal nucleus formation step S122, TMAl gas was supplied continuously whereas the ammonia gas supplied intermittently with a temporal pattern of 5-second supply and 3-second halt. A large number of the crystal nuclei 122N were formed in such a manner that they were distributed over the surface of the PSS 110A. Then in the embedding step S124, a condition called an enhanced lateral growth scheme was used for growing the AlN crystal. The condition for the enhanced lateral growth in the embedding step S124 was to supply TMAl gas continuously and ammonia gas intermittently, while the temperature and gas flow rate were modified from those in the crystal nucleus formation step S122. Note that crystal growth under the condition for the embedding step S124 progresses in a manner the crystal spreads in-plane direction of the substrate. This is because molecules of the material gas or atoms decomposed therefrom are prone to migrate during the growth process, and the crystal is grown by expanding its c-plane as much as possible. In such a growth process, the threading dislocations tend to extend themselves along in-plane direction. Therefore, threading dislocations run toward closing position of grown crystals of AlN crystal from the crystal nuclei 122N, where each of the crystals expands itself in-plane direction, which results in reduction of threading dislocation extending across the thickness direction. Therefore, the threading dislocation density on the surface of the base crystal layer 122 was decreased. Such scheme of the crystal growth was adopted to fabricate the base crystal layer 122 with reduced threading dislocations (FIG. 4C). The specific conditions used in this process were ones in Non Patent Document 2 by the inventor and others. It should be noted that the balance among raw material supply amounts was such that amount of TMAl gas, which is a raw material of Al, surpasses amount of ammonia gas, which is a raw material of N, in consideration of the flow rates of raw material gasses and the intermittent supply pattern of the ammonia gas. Since this condition can suppress anomaly generation in crystal nucleation that could be observed when N atom was disposed in place of Al atom on the surface of the growing crystal, the condition was such a condition that can suppress the lattice dislocations that would have started at such crystal nucleation anomaly.

Figure 7A:
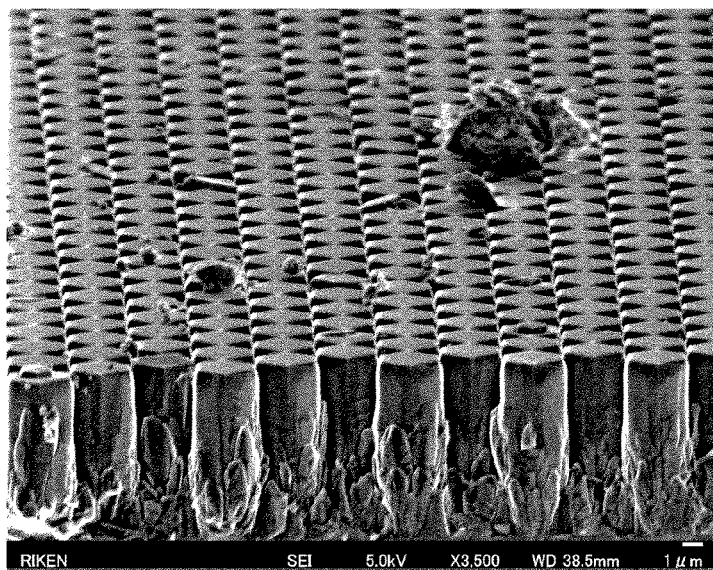
FIG. 7 is a scanning electron microscope (SEM) top plan view micrograph that shows typical pillar for representative samples obtained in a preliminary experiment for a working example as described herein.
Figure 7B:
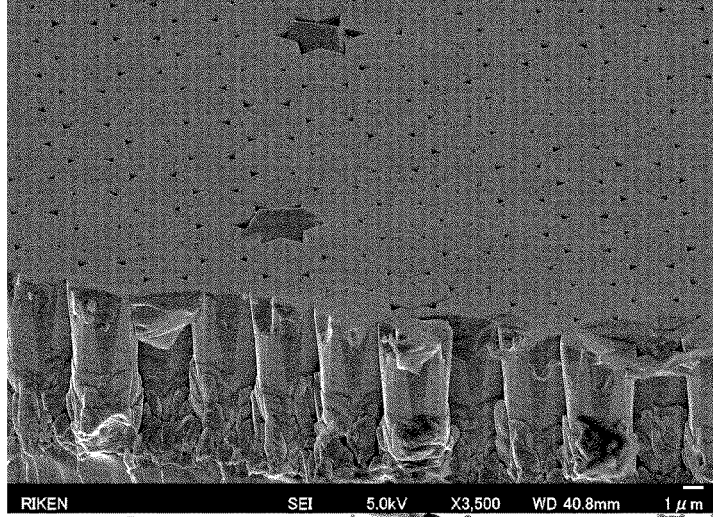
Figure 7C:

A preliminary experiments were conducted for the present working example in determining conditions for performing integration step S126 following the embedding step S124. In particular, using the PSS 110A on which protruding portions 112 had been formed through processes until the embedding step S124, it was examined whether the pillars 124 could grow thereon or not and whether the integration section 126 could be fabricated or not. In doing so, we expected that it should be possible that the buffer layer 120 formation could be affected if conditions related to the raw material gasses for the MOVPE method were modified. Then, for the purpose of determining conditions for practicing the integration step S126, a series of preliminary experiments have been carried out to determine V/III ratio between TMAl gas as a group III raw material and ammonia gas as a group V material for growing the pillars 124 in the integration step S126 in FIG. 3, among conditions related to raw material gasses in MOVPE for the buffer layer growth step S120A. In the preliminary experiments, a number of samples were manufactured through processes until growth of the buffer layer 120A by changing the V/III ratio over 0.5-20 range. As a result, it was found that the pillars 124 could grow with a V/III ratio over 1.0-10, where the range was not adopted ordinarily in cases when pillars 124 were not fabricated. FIG. 6 is a differential interference contrast microscope photograph showing typical pillars obtained in a preliminary experiment for the working example, or Samples 1-3 obtained by three condition, in which V/III ratio is smaller than 5. Also, FIG. 7 is a bird's-eye view photograph of scanning electron microscope (SEM) that shows typical pillars 124 for representative samples obtained in a preliminary experiment for the working example. Samples 1-3 are shown in FIGS. 6A-6C respectively, and in FIGS. 7A-7C respectively. Samples 1-3 were manufactured with different ratios between the TMAl and ammonia gasses; more specifically, they were samples grown for conditions of V/III ratios of 4.2, 3.7, and 2.6, respectively.

Common features to all Samples 1-3 include one pillar 124 was formed in an elongated shape from each of protruding portions 112. Another common feature to the Samples was that, although small size crystal pieces were formed around pillars 124 near protruding portions 112 of each pillar 124, such crystal pieces were adhered to the PSS 110A on their protruding portion 112 side only. It seemed that the crystal pieces were not related to the protruding portions 112.

In contrast to these, several differences were observed among the Samples. First, as clearly imaged in FIG. 6A, pillars were grown while their hexagonal pillar shape for Sample 1 was substantially maintained. The pillars in Sample 1 in FIGS. 6A and 7A are independent from one another, and such a structure as the integration section 126 (FIG. 2) was not formed. Although gaps corresponding to the gap G (FIG. 2) were formed, the pillars were not connected with each other.

However, in the case of Sample 2, pillars were grown into a widened shape with increasing its cross section according to distance away from the protruding portions 112 while their hexagonal shape of in the cross section was maintained, as found in FIGS. 6B and 7B. The pillars coalesced with neighboring pillars to form the integration section at midway height of the growth. The coalescence was started from the apexes of the hexagons, and apertures corresponding to the gap G remained in directions of hexagonal sides seen from axes of the hexagons. It seemed that not all pillar had grown with good crystal, that is, some pillars were formed with irregular face ("facet") that was not parallel to the substrate surface, and crystal of such facets was grown too.

In Sample 3 in FIGS. 6C and 7C, pillars were grown with steeper widening shape. The pillars coalesced in such a manner that no gap were observed on the top surface of the pillars and an integration section was formed, the resulting crystal was grown to have a certain thickness from a height where the coalescence has started. The integration section 126 that was formed by the integrated pillars started where the gaps were disappeared. In Sample 3, not all pillars had sound grown crystal, and more number of pillars with facet were observed than Sample 2.

As a result of the preliminary experiments, detailed shapes of the pillars 124 were observed in Samples 1-3 in FIGS. 6 and 7. In particular, based on Samples 1 and 2, it has been concluded that the pillars 124 are independent from one another by gaps G interposed therebetween, until they begin to coalesce with one another. Sample 3 may well be the same on this point. Moreover, side surfaces of the pillars 124 have a shape of a part of hexagonal pillars or hexagonal cones whose axes are perpendicular to one surface 104 of the PSS 110A (FIG. 2). The pillars 124's geometry is such that they point their own apexes to ones of neighboring pillars.

Moreover, growth conditions determine whether the side surface forms hexagonal pillar or hexagonal cone, that is, how steep widening is formed in the shape. In short, it was found that the smaller V/III ratio is, the steeper the widening becomes because of facilitated growth along a direction parallel to c-plane ("c-plane growth"). It was confirmed that the pillar 124 will connect with one another and the integration section 126 is formed in the case the V/III ratio is 3.7 or below, where the value of 3.7 corresponds to fabrication condition for Sample 2.

In addition to V/III ratio, the inventor conducted optimization for other conditions that may influence crystal growth, in particular, for temperature of the substrate and the ratio of carrier gasses (nitrogen and hydrogen) including their flow rates. A general relationship found in such conditions was that, the lower the substrate temperature is, the narrower area of the top surface of hexagonal pillars 124 becomes, leading to decreasing cross section of the grown pillars 124. Conversely, the higher the substrate temperature is, the wider area of the top surface of hexagonal pillars 124 becomes, which corresponds to vertical or clearly widened shape in the side surfaces of the pillars 124 toward direction of growth. The other condition, the ratio of carrier gasses, was that, the more the nitrogen gas is increased, the sooner the gap G is closed and the higher the occupation ratio of the pillars 124 becomes during the growth. In this working example, the substrate temperature was 1400° C. and flow rates for $H_2$ and $N_2$ gases are 5200 sccm and 4000 sccm, respectively. The total duration of the crystal growth time for the buffer layer growth step S120 process in FIG. 3, excluding the smoothing step S1262, was set to 2 hours.

Figure 8:
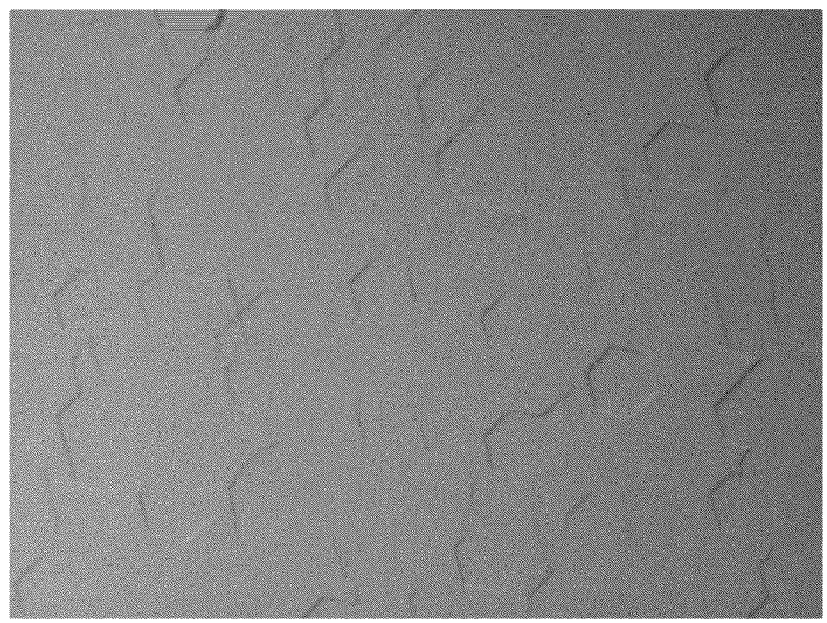
FIG. 8 is a differential interference contrast microscope photograph captured through surface observation of a part of a sample's integration section, which was manufactured in a preliminary experiment for a working example described herein, with a tentatively optimized growth condition.
Figure 9:
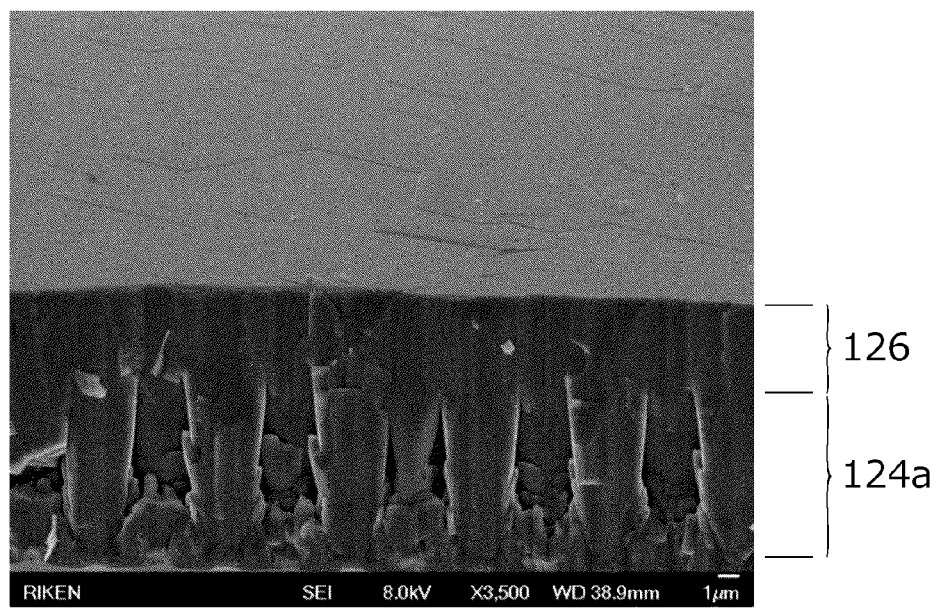
FIG. 9 is an SEM top plan view micrograph that shows a buffer layer of an optimized sample in a preliminary experiment for a working example as described herein.
Figure 10:
FIG. 10 is a photograph showing cross section by transmission electron microscope (TEM) of a buffer layer of an optimized sample in a preliminary experiment for a working example as described herein.

After optimization of conditions for the integration section 126 according to the knowledge above, the buffer was successfully fabricated with crystal quality that is able to work as a template for subsequent crystal growth of the ultraviolet emission layer 130. FIG. 8 is a differential interference contrast microscope photograph captured through surface observation of integration section 126 of a sample that was manufactured with a growth condition tentatively optimized in a preliminary experiment for the working example, or an "optimized sample." FIG. 9 is an SEM bird's-eye view photograph that shows a buffer layer of an optimized sample in the preliminary experiment for the working example. FIG. 10 is a cross section photograph showing a buffer layer of an optimized sample obtained through transmission electron microscopy (TEM). FIG. 9 was captured from a bird's-eye view direction after exposing cross section of formed integration section 126 and the smoothing layer 1262. FIG. 10 was an image of a plane that passes the protruding portions 112 of a sample for imaging of sliced PSS 110A captured with transmission mode.

In the optimized sample shown in FIGS. 8 and 9, the smoothing was carried out in such a manner that no apparent influence due to the pillars 124 and gap G was found on the outmost surface of the integration section 126. As shown in FIG. 10, it was observed that the threading dislocations in pillars 124 extending toward the integration section 126 were suppressed, and it was also observed that the crystal was grown with low dislocation density. Noted that there were slight steps on the outmost surface of the integration section 126 that reflect crystal orientation as shown in FIGS. 8 and 9.

Furthermore, after evaluating crystallinity on the optimized sample using an ω scan X-ray rocking curve (not shown), FWHM (full width half maximum) values for (0002) plane peak and (10-12) plane peak were 419 arcsec and 499 arcsec, respectively. Based on these measurement results, the inventor concluded that AlN crystal was grown while threading dislocations were suppressed even for the optimized sample having the buffer layer 120A with pillars 124 and the gaps G.

Figure 11:
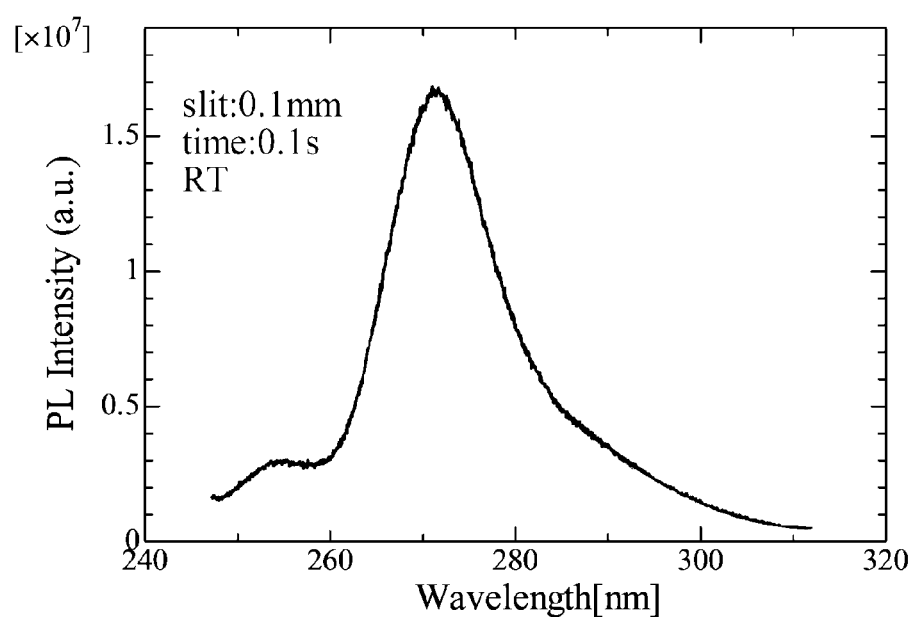
FIG. 11 shows a graph indicating photoluminescence spectrum obtained from a working exemplary sample for an LED element as described herein.
Figure 12A:
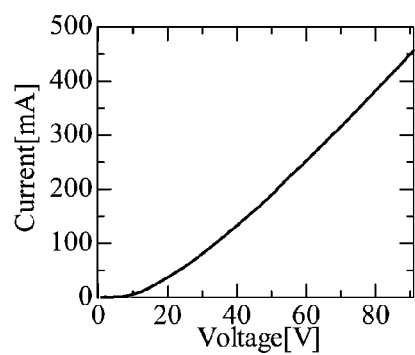
FIG. 12A shows diode characteristics.
Figure 12B:
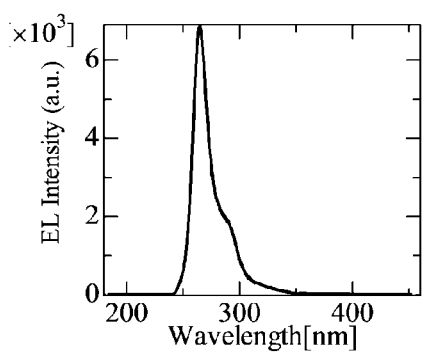
FIG. 12B shows an electroluminescence spectrum.
Figure 12C:
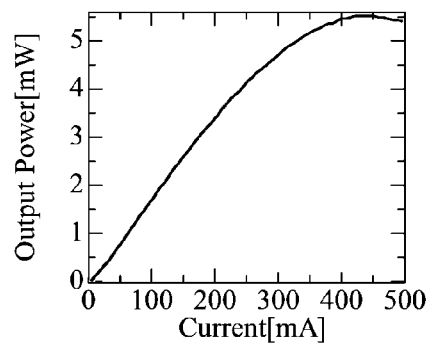
FIG. 12C shows integrated optical output performance.
Figure 12D:
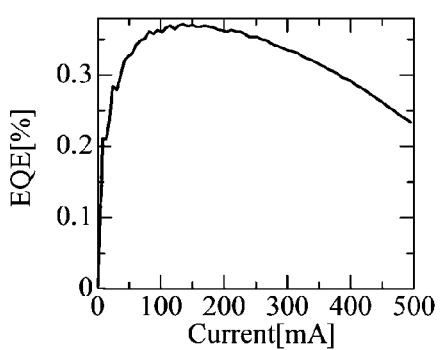
FIG. 12D shows measured values of an external quantum efficiency.

Then, a working exemplary sample of AlGaN light emitting diode (LED) was manufactured by fabricating the buffer layer 120A while the same conditions for the integration step S126 or before as those for the optimized sample were adopted, where the ultraviolet emission layer formation step S130 and the electrode formation step S140 were carried out. FIG. 11 shows a graph indicating photoluminescence spectrum obtained as stated above, and FIG. 12 shows graphs indicating actually measured performance in another working exemplary sample for an LED element fabricated in the same processes. FIG. 12A shows diode characteristics, FIG. 12B shows an electroluminescence spectrum, FIG. 12C shows integrated optical output performance for 200-400 nm wavelength range, and FIG. 12D shows measured values of external quantum efficiency for 100 mA current operation.

Actually measured photoluminescence data in FIG. 11 was obtained at room temperature (ambient temperature of 20° C.). This integrated emission intensity means that the internal quantum efficiency $\eta_{IQE}$ of around 20% has been achieved. The fact that such a high internal quantum efficiency $\eta_{IQE}$ is achieved shows that AlGaN ultraviolet LED element manufactured on a template of a buffer layer with pillars can work properly as a light emitting-diode for an ultraviolet range. At the same time, the fact suggests that the achieved internal quantum efficiency $\eta_{IQE}$ is not tantamount to an internal quantum efficiency $I_{ME}$ of 50%, which is obtained for the ultraviolet LED 100 that use conventional buffer layer. The inventor is afraid that the internal quantum efficiency $\eta_{IQE}$ value has been affected by the steps found on the outmost surface of the integration section 126 of the buffer layer 120A as in FIGS. 8 and 9, which has been fabricated with tentatively optimized conditions. Therefore, even further optimization is necessary in the crystal growth conditions for the working exemplary samples, the inventor considers the above experiment results are sufficiently promising. This is because, although the internal quantum efficiency $\eta_{IQE}$ before optimization was merely 1% or so in the conventional ultraviolet LED 100, the internal quantum efficiency $\eta_{IQE}$ over 50% has been actually obtained after a careful optimization was carried out for the buffer 120. Considering the fact that the ultraviolet LED 100A of the present embodiment includes the pillars 124 and gaps G, it can be said that sufficient practicability of the crystal growth scheme has been confirmed by the internal quantum efficiency $\eta_{IQE}$ of around 20%.

Furthermore, when the working exemplary sample was operated as an LED, the maximum output was 5.5 mW (cw output) at a wavelength of 265 nm as shown in FIG. 12, which corresponds to a maximum external quantum efficiency $\eta_{EQE}$ of 0.37%. These results are not comparable with an external quantum efficiency $\eta_{EQE}$ of 4% for the conventional ultraviolet LED 100. However, the data in FIG. 12 is an actual example of operation of the light-emitting diode in actually manufactured samples of the ultraviolet LED 100A by using the buffer layer 120A, thus it is an experimental fact that shows reality of the structure including the pillars 124 and the gaps G in the ultraviolet LED 100A of the present embodiment.

As stated above, it has been confirmed in the working example that ultraviolet LED 100A can be manufactured using the pillars 124 and the buffer layer 120A. It has been confirmed that the condition for such structure can be optimized. Also it has been confirmed that the working exemplary sample for the ultraviolet LED 100A is operable in a deep UV range.

Variations of the Embodiment

The present embodiment can be reduced into practice in various implementations in addition to the above-mentioned description for the embodiment and the working example.

Variation 1: Modification of Condition for Integration Step S126

The repetition of the ammonia pulse-flow growth method and the simultaneous supply growth described with reference to the embedding step S124 included in the buffer layer growth step S120 may be adopted in the integration step S126 for growing the pillars 124. The repetition step may be carried out either before or after beginning of coalescence of the pillars 124, or both of them. The repetition of the ammonia pulse-flow growth method and the simultaneous supply growth in the halfway of the growth of pillars 124 would enable reduction of crystal lattice dislocation that may be generated during pillar coalescence.

Variation 2: Addition of the Smoothing Layer 1262

The smoothing layer 1262, which was not adopted in the working example, can be formed as a part of the integration section 126 as shown in FIG. 2. The smoothing layer 1262 can be formed by modifying crystal growth conditions of the integration step S126 into ones suitable for realizing improved crystal quality in the ultraviolet emission layer 130. One of the modifications in the condition is the V/III ratio. The V/III ratio has influence on c-plane growth as can be understood from the fact that the ratio modified the connection of pillars 124 as in the FIGS. 6 and 7. A condition with reduced V/III ratio, which facilitates the c-plane growth, would also improve smoothness of the smoothing layer 1262 in the integration section 126. Thus a preferable numerical range for the V/III ratio should be 3.7 or below, in molar fraction, on account of the smoothness of the smoothing layer 1262. In addition to the smoothness improvement of the smoothing layer 1262, using small V/III ratio may also be beneficial due to the effect of closing apertures that may communicate with gap G among the pillars 124 as have been observed in Samples 2 and 3 in FIGS. 6 and 7. Moreover, such a condition may well contribute to removing obstacle factors against improving the internal quantum efficiency $\eta_{IQE}$, such as the steps found on the outermost surface of the integration section 126 before fabrication of the smoothing layer 1262.

Moreover, in the smoothing step S1262, it is possible to suppress dislocations further if an ammonia pulse-flow growth method and a simultaneous supply growth are performed repeatedly. Among others, when the lattice dislocations generated in the integration section 126 due to the connection of the pillars 124 are reduced through the smoothing layer 1262, the quality of the crystal would be made close to that for the conventional buffer 120, thereby the adverse effect of the pillars 124 concerning the internal quantum efficiency $\eta_{IQE}$ should be minimized.

Variation 3: Modification of Protruding Portion Geometry

In the ultraviolet LED 100A described above in the present embodiment, the symmetry of the crystal lattice on one surface of the PSS 110A, or the sapphire substrate, is that for (0001) surface orientation, or substantially three fold rotational symmetry. The geometry of the protruding portion 112 array of the triangular lattice also has the three fold rotational symmetry. As a result, shape of the cross section of the pillars 124 of the hexagonal pillars formed reflecting the symmetry of a crystal lattice corresponds to symmetry of the pillar 124 geometry, which reflects the array of the protruding portions 112 (FIGS. 6A and 6B). The inventor supposes a reason why actual crystal in the integration section 126 had good quality should be because crystal growth becomes easy when the cross section shape of the pillar 124 and the pillar geometry correspond with each other.

However, the array geometry of the protruding portions 112 on the PSS 110A is not limited to the specific structure in the present embodiment. For example, direction of the triangle lattice only in the array geometry may be changed through a rotation operation by 90 degrees. Meanwhile, the circle outline shape and the island pattern for the each protruding portion 112 are kept unchanged, and the arrangement of the protruding portion 112, or the triangle lattice itself, is also unchanged. By way of this rotation operation, the crystal lattice orientation around c-axis relative to the direction of the triangle lattice may be changed. If a PSS having the resulting configuration in the array of protruding portions is adopted, each of the pillars should have a side of a hexagon that is placed opposite to a side of a hexagon for the other pillar in the neighboring pillars. In such an array configuration, sides of hexagons begin to connect with each other at the outset of formation of the integration section 126. As a result, the coalescence timing would be changed, and the outset position of formation of the integration section 126 by connecting the pillars with each other in a direction of crystal growth should be changed. It will be possible to adjust the amount of lattice dislocation caused by the pillar coalescence in the integration section based on this property.

It should be noted that the orientation of protruding portions 112 in the PSS 110A is not limited to one in the FIG. 5 or its 90 degree rotated one, rather the orientation may be an arbitrary one, because the orientation should be determined by for example a resist pattern. Moreover, the arrangement of the protruding portions 112 and their size are just examples indicating actually fabricated ones, and their sizes can be changed easily. It is not always necessary to provide only a single type of shape for the protruding portions 112. Furthermore, modifying the direction of the protruding portion arrangement will open up further possibility to grow higher quality crystal when optimization of the substrate temperature or gasses supply conditions is conducted. This is because such modification should alter circumstances related to dislocation creation in crystal due to the pillar coalescence with one another.

Furthermore, geometrical shape or arrangement of gaps G may be changed when the arrangement of protruding portions 112 is changed. This means that direction conversion capability for light can be adjusted. For example, changing shape of each gap G would be useful for adjusting degree of scattering, refraction, and reflection by the gap G and surface of the pillars 124. In addition high regularity in the array of the protruding portions 112 means that transmissive diffraction, in which direction converted rays of light due to scattering and so only at gap G and the interface may make constructive interference in a certain direction, which may lead to enhancement of the direction conversion capability or adjustable nature thereof.

Also, the size or arrangement of the protruding portions 112 determines size of each pillar 124, pitch P (FIG. 2) of the pillars 124 in the buffer layer 120A, and height H (FIG. 2) where the pillars 124 connect with one another. The sizes and pitch for the pillars 124 and gap G may influence, in the first place, on the function of crystal growth expected to the buffer layer 120A, and second, on the direction conversion capability in optical aspect in the buffer layer 120A in combination with the emission wavelength. Therefore, it is possible to increase the internal quantum efficiency $\eta_{IQE}$ and the light extraction efficiency $\eta_{LEE}$ of the ultraviolet LED 100A at the same time by adjusting size and arrangement of the protruding portions 112.

As stated above, the quality of crystal or the direction conversion capability can be adjusted by carrying out modifications of various kind while associating the arrangement of the protruding portions formed with the PSS.

The present embodiments have been described specifically throughout the description set forth herein. Any parts of the description in this specification, including the embodiment and practical working example are provided for the purpose of explanation; thus the scope of the invention should be determined based on recitation of the claims. Furthermore, variations based on any combination of the embodiments should be considered in the present disclosure, which variations should be also within a scope of the present invention.

INDUSTRIAL APPLICABILITY

The ultraviolet light-emitting diode described herein is applicable to any appliances that use ultraviolet radiation emitted therefrom.

REFERENCE NUMERAL LIST

100, 100A ultraviolet LED (DUVLED)
102 light extraction surface
104 one surface, of sapphire substrate
110 sapphire substrate
110A sapphire substrate with the array of protruding portions (PSS)
112 protruding portions
120, 120A buffer layer
122N crystal nucleus
122 base crystal layer
124 pillar
124a pillar array section
126 integration section
1262 smoothing layer
130 ultraviolet emission layer
134 recombination layer
138 contact layer
140 first electrode
150 second electrode

What is claimed is:

1. A method for manufacturing an ultraviolet light-emitting device comprising steps of:
    preparing a single crystal sapphire substrate having an array of protruding portions on a surface thereof;
    a buffer layer formation step of an AlN crystal on the surface using an MOVPE method with material gasses of TMAl (tri-methyl-aluminum) gas and ammonia gas;
    forming an ultraviolet emission layer as a layered stack including, in order from the buffer layer, an n-type conductive layer, a recombination layer, and a p-type conductive layer;
    forming a first electrode in electrical connection with the n-type conductive layer; and
    forming a second electrode in electrical connection with the p-type conductive layer;
    wherein the buffer layer formation step includes;
    a crystal nucleus formation step that generates crystal nuclei of AlN;
    an embedding step that fills the spacing among the seed crystal nuclei and forms a base crystal layer of AlN that is carried out subsequent to the crystal nucleus formation step, the embedding step including carrying out an ammonia pulse-flow method growth and a simultaneous supply growth at least one time each, the ammonia pulse-flow method being performed under an enhanced lateral growth condition, with which AlN crystal coherent with the seed crystal nuclei spreads in-plane direction of the single crystal sapphire substrate; and
    a pillar growth and integration step for forming a pillar array section having an array of pillars that is carried out subsequent to the embedding step that fills the spacing among the seed crystal nuclei, such that each tapered pillar extends from the base crystal layer of AlN on one of the protruding portions and has a base and a tip, each tapered pillar being wider at the tip than at the base, and each tapered pillar being in contact with one of the protruding portions at the base and such that an integration is formed section by merging the pillars together with one another at the tip.

2. The method for manufacturing an ultraviolet light-emitting device according to claim 1, further comprising removing the sapphire substrate, subsequent to the ultraviolet emission layer growth step.

3. The method for manufacturing an ultraviolet light-emitting device according to claim 1,
    wherein a V/III ratio denoting a group V to group III ratio in amount-of-substance for material gasses is set between 1.0 and 10 inclusive at least for a period in the pillar growth and integration step.

4. The method for manufacturing an ultraviolet light-emitting device according to claim 1,
    wherein the embedding step includes repeating an ammonia pulse-flow growth method and a simultaneous supply growth method alternatingly plural times.

5. The method for manufacturing an ultraviolet light-emitting device according to claim 1,
    wherein the buffer layer formation step further includes smoothing a surface of the integration section, subsequent to the pillar growth and integration step.

6. The method for manufacturing an ultraviolet light-emitting device according to claim 5,
wherein a V/III ratio denoting group V to group III ratio in amount-of-substance for material gasses is set between 1.0 and 10 inclusive during at least a certain period in the smoothing step.

* * * * *